United States Patent [19]

Ehnholm

[11] Patent Number: 5,023,555
[45] Date of Patent: Jun. 11, 1991

[54] MAGNETIC RESONANCE IMAGING
[75] Inventor: Gosta J. Ehnholm, Helsinki, Finland
[73] Assignee: Instrumentarium Corporation, Helsinki, Finland
[21] Appl. No.: 459,453
[22] Filed: Jan. 2, 1990
[30] Foreign Application Priority Data Jan. 3, 1989 [GB] United Kingdom ............... 8900030

[51] Int. Cl.⁵ .......................................... G01R 33/20
[52] U.S. Cl. ................................... 324/318; 324/320
[58] Field of Search ............... 324/300, 307, 309, 318, 324/319, 320, 322; 128/653 A

[56] References Cited

U.S. PATENT DOCUMENTS

2,947,920 8/1960 Hall ..................................... 324/319
4,425,547 1/1984 Sugimoto ............................ 324/318
4,695,801 9/1987 Arakawa ............................. 324/318

Primary Examiner—Michael J. Tokar
Attorney, Agent, or Firm—Chilton, Alix & Van Kirk

[57] ABSTRACT

The invention provides a magnetic resonance imaging apparatus having a primary field generating means for generating a substantially uniform magnetic field, wherein that said primary field generating means is arranged in use to generate a magnetic field the field direction of which varies with time, e.g. a rotating field. The varying field operates to average out from the magnetic field experienced by the sample being imaged at least some of the external perturbing magnetic fields so reducing the sensitivity of the apparatus to such external fields.

16 Claims, 5 Drawing Sheets

MAGNETIC RESONANCE IMAGING

The present invention relates to improvements in and relating to methods of magnetic resonance imaging and apparatus therefor.

Magnetic resonance imaging (MRI) is a non-invasive imaging technique which is achieving progressively wider acceptance by physicians for use in medical diagnoses. The technique was developed by Lauterbur who published the first magnetic resonance (MR) images in 1973. By 1985, at least 500 MR imagers had been installed for clinical use around the world (see for example Lauterbur, Nature 242: 190-191 (1973), Steinberg, A. J. R. 147: 453-454 (1986) and Steiner, A. J. R. 145: 883-893 (1985)).

MR images are generated by manipulation of the MR signals detected from a sample, for example a human or animal body, placed in a magnetic field and exposed to pulses of radiation, typically radiofrequency (RF) radiation, of a frequency selected to excite MR transitions in selected non-zero spin nuclei (the "imaging nuclei") in the sample.

In order to encode spatial information into the MR signals during the imaging procedure, the magnetic field experienced by the sample is modified by the imposition onto a primary uniform magnetic field $\underline{B}_o$ of magnetic field gradients. Thus, for example, since the resonating frequency of an imaging nucleus is dependent on the strength of the magnetic field ($\underline{B}$) in which it lies (as well of course as on factors such as the chemical environment and the isotopic nature of the nucleus (which may for example be $^1H$, $^{13}C$, $^{19}F$), by imposing a field gradient in the z direction on the sample during periods during which the sample is exposed to pulses of the MR transition exciting radiation, the position and width in the z direction of the slice through the sample in the xy plane from which the MR signals are emitted is defined by the strength of the primary field $\underline{B}_o$, the applied field gradient $d\underline{B}/dz$, and the frequency and bandwidth of the exciting pulses.

Subsequent imposition of further field gradients in the period between the initial pulse of the MR transition exciting radiation and the period during which the MR signal is detected and also during that period of detection can similarly encode x and y spatial information into the MR signal.

There are several different encoding techniques known in the art, but all rely upon the imposition onto the primary field of field gradients of different magnitudes and/or in different directions, in particular sequences within the MR-transition-excitation/MR-signal-detection cycles.

Moreover, using different pulse and detection sequences, for example spin echo, spin inversion, spin recovery, etc., different types of MR images can be generated from the detected signals, for example images in which the pixel intensity is proportional to the density of the imaging nuclei in the corresponding volume element of the sample (e.g. proton density images), $T_1$ images and $T_2$ images.

For a general discussion of the principles of MRI, the reader is referred to the articles by Bottomley, Rev. Sci. Instrum. 53: 1319-1337 (1982), Hinshaw et al., Proc. IEEE 71: 338-350 (1983), House, IEEE Trans. Nucl. Sci. NS-27: 1220-1226 (1980), Koutcher et al., J. Nucl. Med. 25: 371-382 (1984), Mansfield et al. in "Advances in Magnetic Resonance", edited by Waugh, Academic Press, New York (1982), Pykett, Sci. Am. 246: 54-64 (1982), Twieg, Med. Phys. 10: 610-621 (1983) and Kean et al. "Magnetic Resonance Imaging", Heinemann, London (1986).

In a MR imager, the primary magnetic field $\underline{B}_o$ is conventionally generated by a superconducting magnet, a resistive magnet or a permanent magnet. The choice of the primary magnetic field strength used in MRI affects the quality and characteristics of the images that can be generated and also affects the image acquisition time and the manufacturing and running costs of the MR imager. Thus, for example, for a given image acquisition procedure, the use of higher strength primary fields results in improved signal to noise (SN) ratios. As a result, the best MR images that have so far been obtained have been produced using the large primary magnetic fields that can be generated by superconducting magnets. This is because such magnets give very strong, stable and homogeneous fields while at the same time providing some shielding against external perturbing magnetic fields. The disadvantages, however, are that such magnets are very expensive and are very difficult to service and maintain and also that it is now recognized that there are dangers associated with the use of high fields.

At lower fields, for example 2000 gauss, resistive magnets may be used, and at fields of 200 gauss or less such magnets are quite inexpensive and simple to operate and install. At low fields, however, technical problems arise, in particular the poor SN ratio which results from the low MR signal amplitude and frequency and the increased sensitivity to external magnetic disturbances, for example due to perturbing magnetic fields generated by electrical motors, by moving ferromagnetic masses, etc. Such perturbing field strength is low, affect the field gradient encoding of the MR signals giving rise to noise, to ghosts and to other undesired distortions of the MR image. Moreover, low strength primary magnetic fields are difficult and expensive to shield.

The first of these technical problems, that of poor SN ratios, has been addressed in a variety of ways. Thus, for example Hafslund Nycomed in WO-A-88/10419 and Lurie et al. in J. Magn. Reson. 76: 360-370 (1988) have described the use of dynamic polarization, produced by stimulation of coupled ESR transitions, to increase signal strength and Stepisnik et al. in Society of Magnetic Resonance in Medicine, Seventh Annual Meeting, 20-26 Aug. 1988, page 1060, have suggested that polarization may be enhanced by pulsing the imaging nuclei with a higher magnetic field prior to detection of the MR signals. It is also possible to increase the SN ratio by decreasing the noise of the MR signal detector, the RF receiver coil, by cooling it with liquid nitrogen and/or by making it of a superconductive material.

It is a particular objective of the present invention to address the second of these two technical problems and to provide a means whereby the sensitivity of MR imaging apparatus to external magnetic disturbances may be reduced.

It is therefore proposed that the sensitivity to external magnetic disturbances of a MR imager having a primary magnetic field generating means (a $\underline{B}_o$ coil) be reduced by arranging the primary field generating means to generate a primary magnetic field the field direction of which varies with time, for example a rotating primary field.

Viewed from one aspect, the invention thus provides a magnetic resonance imaging apparatus having a primary field generating means for generating a substantially uniform magnetic field, characterized in that said primary field generating means is arranged in use to generate a magnetic field the field direction of which varies with time.

Viewed from a further aspect, the invention also provides a method of magnetic resonance imaging of a sample which method comprises placing a sample within a substantially uniform primary magnetic field, exposing said sample to radiation of a frequency selected to excite nuclear spin transitions in selected non-zero spin nuclei therein, imposing a magnetic field gradient on said primary field, detecting magnetic resonance signals from said selected nuclei, and generating an image of said sample from said detected signals, characterized in that the field direction of said primary field is caused to vary with time.

In the method and apparatus of the invention, the nature of the time variation of the primary field direction is not critical, but should be such as to average out from the magnetic field experienced by the sample at least some of the external perturbing magnetic fields.

For convenience sake, the field generating means may thus be arranged to generate a cyclical magnetic field, e.g. a rotating primary field, preferably a rotating field for which the field direction rotates about and particularly preferably is perpendicular to a fixed axis. The axis and rate of rotation can be selected at will or may be variable. More complicated paths for the time-varying primary field vector can be adopted of course; generally, however, the time variation will conveniently be such that the sam path is repeatedly traced.

Thus, taking for example the case where the primary field $\underline{B}_o$ rotates about and is perpendicular to the z axis, the spins of the imaging nuclei will process about $\underline{B}_o$ and the effect of the rotation of the primary field is to average out the influence of perturbing magnetic fields in the x and y directions. The perturbation damping effect of the technique of the invention may be illustrated using as an example the case of the two dimensional Fourier transform (2DFT) imaging technique. In this technique, a first field gradient (the slice selection gradient) is imposed along a first direction during the initial RF exciting pulse of each pulse-and-detection cycle, a second field gradient (the phase encoding gradient) is imposed along a second direction during the period between the initiating RF pulse and the MR signal detection period and a third field gradient (the read gradient) is imposed along a third direction during the MR signal detection operation. In conventional MRI, the first, second and third directions are mutually perpendicular and static and may be taken to correspond to conventional x, y and z directions. Where according to the present invention $\underline{B}_o$ is rotated about the z axis, the field gradients also rotate with it. Considering the phase encoding gradient, the time between applying the RF pulse and detecting the MR signal in a spin echo imaging sequence is $T_{echo}$ a time which is typically at least about 10 milliseconds for a low strength primary magnetic field MR imager. An invariant or slowly varying external perturbing magnetic field will act during this time to blur the phase (and hence the image) unless $\underline{B}_o$ is rotated. With $\underline{B}_o$ rotating, at a rate of $1/T_{rot}$, the perturbing field will change sign every half cycle and its effect can thus accumulate for at most a half cycle, i.e. $0.5\ T_{rot}$.

The damping of the perturbance is thus effective by at least a factor of $0.5\ T_{rot}/T_{echo}$.

The averaging out of the effects of the perturbing fields occurs for all of the volume elements of the sample corresponding to the pixels of the generated image. It is most efficient for canceling out the effects of low frequency perturbing fields, fields which in practice have been particularly troublesome. Perturbing fields at the mains frequency (e.g. 50 or 60 Hz) also cause significant image disturbance and their effects can be suppressed according to the method of the invention by choosing as the frequency of rotation ($2\pi\omega$) for the primary field an even harmonic of the mains frequency.

Thus, the rotational frequency for $\underline{B}_o$ may conveniently be chosen to be in the range of 25–1000 Hz, e.g., 400–100 Hz, especially 100–500 Hz. For imagers arranged to operate with 50 and 60 Hz mains frequencies, the rotational frequency ($2\pi\omega$) for $\underline{B}_o$ might particularly suitably be 100 or 120 Hz respectively whereby to suppress the effects of perturbing fields at the mains frequency and its second harmonic. Alternatively, for 50 and 60 Hz mains frequencies, the rotational frequency for $\underline{B}_o$ might advantageously be selected to be 300 Hz at which image distorting effects for either of these two mains frequencies and their first two harmonics are reduced.

Generally, the efficiency of averaging out of the imaging distorting effects of the external perturbing fields is increased as the rate of rotation of the primary magnetic field is increased. However, the rotation of the primary magnetic field does mean that the sample is subjected to a continuous field change and it is generally accepted that the maximum acceptable rate of change of field is about 6 Tesla per second. Thus, the lower the primary field strength the higher the acceptable rotational frequency for $\underline{B}_o$. For example, at a rotational frequency for $\underline{B}_o$ of 300 Hz, the field strength $\underline{B}_o$ can be up to 3 mT without exceeding the acceptable maximum value for rate of field change.

A rotating primary field $\underline{B}_o$ can for example be produced using a $\underline{B}_o$ coil comprising two orthogonal saddle-shaped sections, fed by two current sources giving sinusoidal currents in quadrature. Alternatively, and more elegantly, it is possible to use tuned coils with wave winding of the type used for the RF-coil described by Savelainen in Acta Polytechnica Scandinavia, Ph 158 (1988), modified to give a homogeneous field. Using such a coil construction, only a single phase current source is required. Another possibility is to use a coil having three sections, spaced apart by 120°, which are energized by a 3-phase current source. The source could be a synchronous 3-phase generator driven from the mains supply by a synchronous motor. The generator output can readily be regulated at low power levels by adjusting the DC current in the rotor winding.

The $\underline{B}_o$ coil can be wound on a non-magnetic former or it can be made like the coils of the type used in the stator of an electric motor or generator with the return flux going through sandwiched ferromagnetic sheets.

The magnetic field gradients and the coils used for imposing them depend of course on the imaging technique used. Known methods include for example 2 and 3-dimensional Fourier transform and projection-reconstruction algorithms. All of these imaging techniques can be performed using a rotating primary field according to the invention by applying field gradients that rotate together with the primary field, i.e. by applying field gradients which are static relative to the rotating primary field vector.

In the method and apparatus of the present invention, it will be particularly advantageous to apply one or more of the techniques mentioned above for the improvement of the SN ratio of the detected MR signal.

Thus, in a preferred embodiment, the apparatus and method of the invention are arranged to apply a strong magnetic field pulse to the sample for each RF excitation/MR signal detection cycle in order to pre-polarize the nuclear spin system. In low strength primary field apparatus the RF-coils which are used to apply the nuclear spin transition exciting radiation will generally be the closest coils to the sample and due to their relatively good coupling coefficient these may particularly advantageously be used for the imposition of the high field pulses. Alternatively, the MR imager may be provided with separate coils for this purpose.

In an alternative preferred embodiment, the apparatus of the invention is provided with means for emitting radiation of a frequency selected to excite an electron spin resonance transition within a paramagnetic centre in the sample which is coupled with the nuclear magnetic spin transition of the imaging nuclei. By means of this dynamic polarization technique, the MR signal amplitude can be enhanced by a factor of at least up to 100. The esr enhancement of the magnetic resonance image and the construction and arrangement of the relevant apparatus features are discussed more fully by Hafslund Nycomed (supra) and Lurie et al. (supra), the disclosures of which are incorporated herein by reference.

In a particularly preferred embodiment of the apparatus of the present invention, the coil used to detect the MR signals, generally at the field of conventional MRI a RF-coil, is provided with cooling means, for example liquid air or liquid nitrogen cooling means, to suppress noise generated by the receiver coil. Alternatively, a superconducting RF receiver coil may be used for the same purpose.

In yet further preferred embodiment, ferrite rods or similar magnetic means may be used to improve the Q value of the RF-coil and the field coupling to the sample.

The apparatus of the invention is preferably provided with shielding means, to diminish the effects of external fields, especially fields having a similar frequency to that of the rotating primary field. For this purpose, it is particularly preferred to encase the field and field-gradient generating means of the apparatus of the invention within a metal, e.g. aluminium, tube. Thus, for example the $\underline{B}_o$ coils, field gradient generating coils and the RF coils of the apparatus may be separated from the current control and supply means by an aluminum tube, for example having a 0.5-3 cm, e.g. about 1 cm, wall thickness. Alternatively, a ferromagnetic shielding tube, or a combination of aluminum and ferromagnetic shielding tubes, may be used.

Preferred embodiments of the method and apparatus of the present invention will now be described by way of example and with reference to the accompanying drawings in which.

Figure 1:
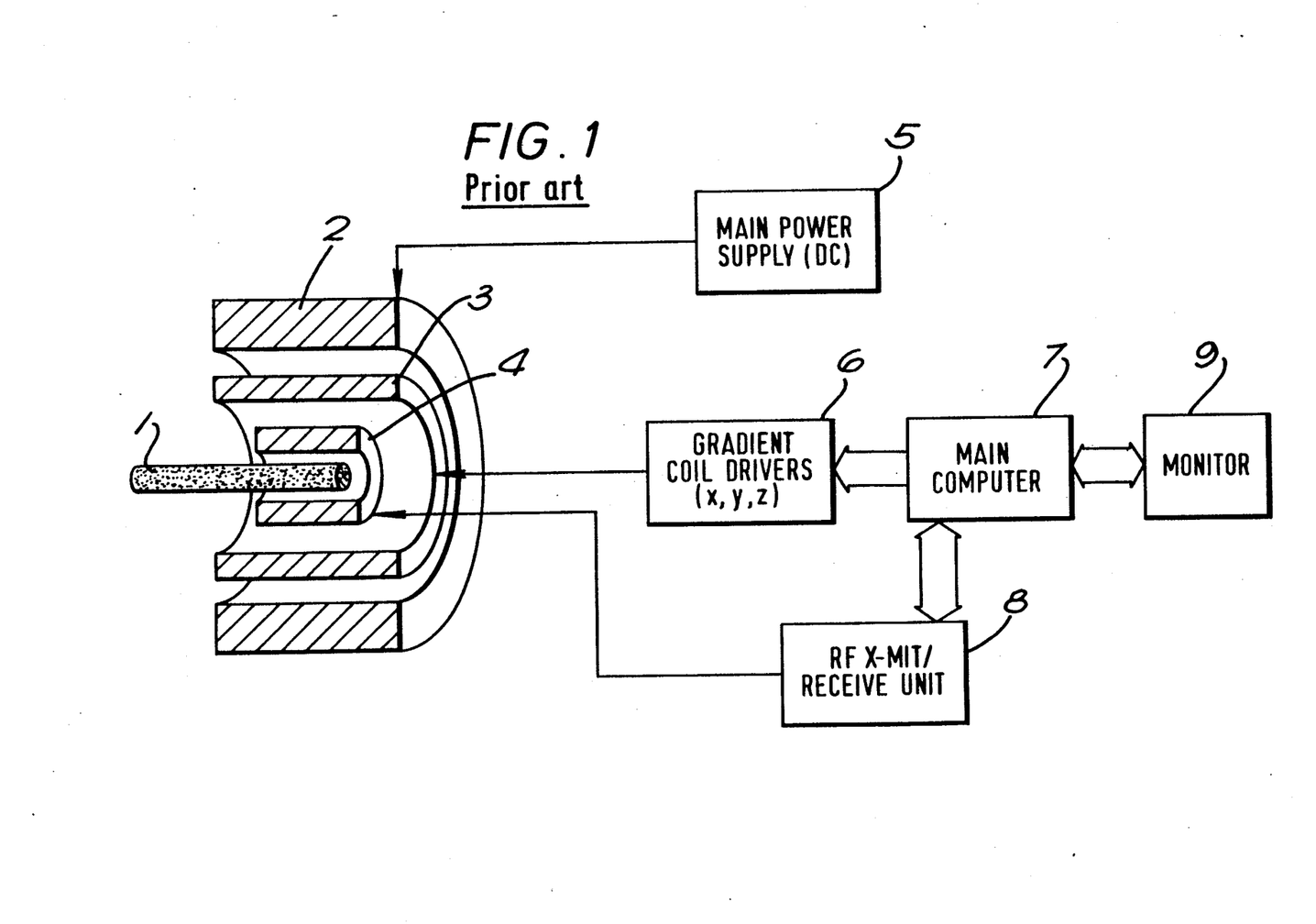
FIG. 1 is a schematic partial cross-section through a conventional magnetic resonance imaging apparatus.

Referring to FIG. 1, there is shown a sample 1 placed within the sample cavity within a primary magnetic field generating coil assembly 2, a magnetic field gradient generating coil assembly 3 and a RF-transceiver coil 4.

The primary field generating coil assembly 2 is an end-compensated solenoid arranged to produce an axial (z) field of 200-2000 gauss. It is provided with correction (shim-) coils (not shown) which produce a field homogeneity of about 20-50 ppm within the sample cavity. The primary field generating coil assembly 2 is powered by a DC power supply 5 and uses a power of about 3-10 kW.

In FIG. 1, the magnetic field gradient generating coil assembly 3 comprises two pairs of saddle coils and one pair of sinusoidal coils arranged to produce field gradients of the type $dB_z/dx$, $dB_z/dy$ and $dB_z/dz$ respectively, of a magnitude of 0.1-1 gauss/cm. The three gradient generating coil pairs are powered by a secondary DC power source 6 with the timing and magnitude of the power supply to each coil pair being controlled by computer 7.

The RF-transceiver coil 4 in the apparatus of FIG. 1 is powered from transceiver unit 8 and is arranged to produce a field rotating in the xy plane at the desired nuclear spin transition exciting frequency, generally a RF frequency. The RF coil 4 is conveniently of the type discussed by Savelainen and can be used both for emitting pulses of nuclear spin transition exciting radiation and for detecting the MR signal (also known as the free induction decay (FID) signal). The RF transceiver unit 8 is also controlled by computer 7 which manipulates the detected signals to produce an image which may be displayed on monitor 9.

Figure 2:
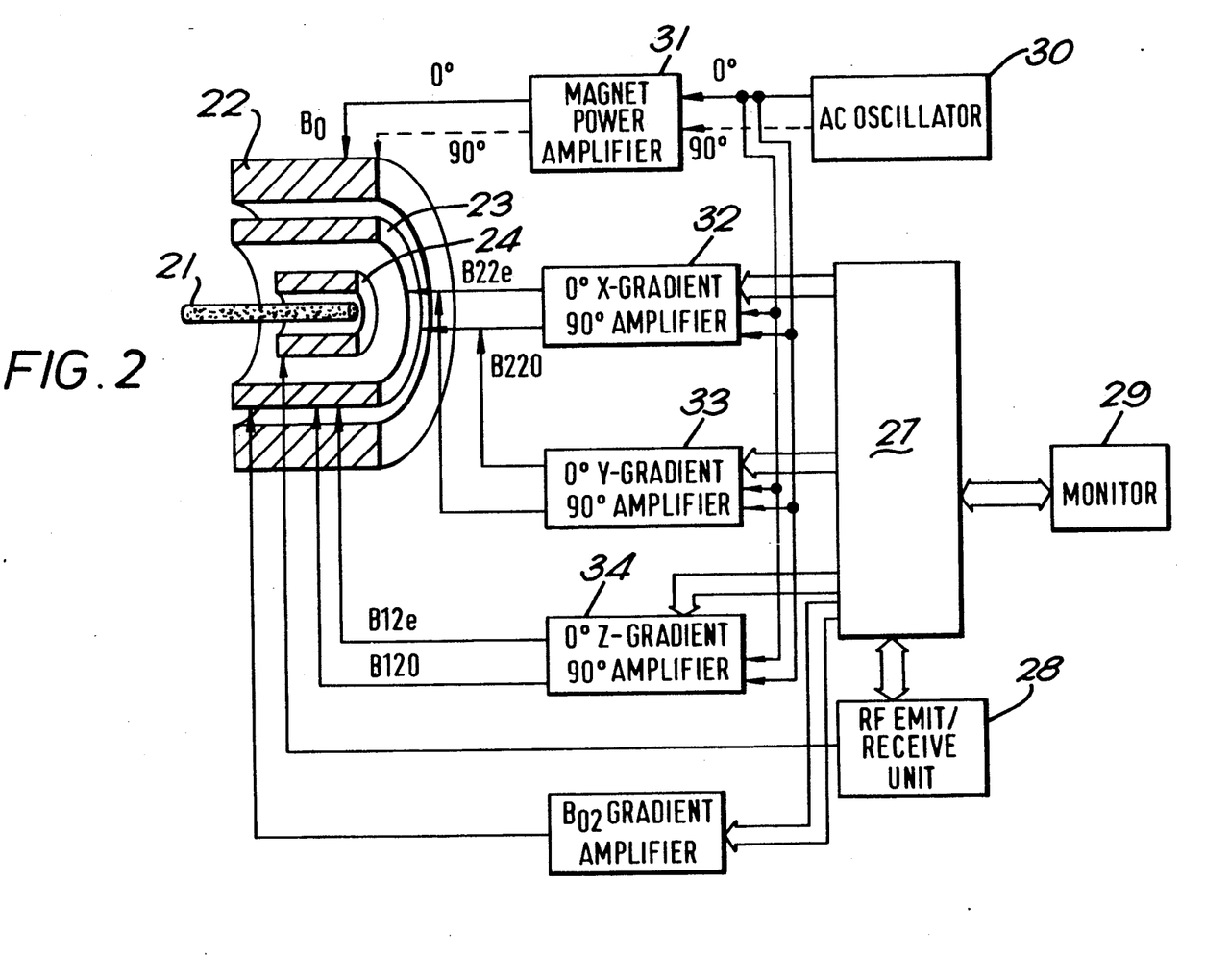
FIG. 2 is a schematic partial cross-section through a magnetic resonance imaging apparatus arranged to operate according to the present invention.

In the apparatus according to the present invention shown in FIG. 2, a rotating field $\underline{B}_o$ could be produced by three mutually perpendicular coil pairs each with separately operated power supplies. However, a preferred arrangement, as shown schematically in FIG. 2, involves using only two mutually perpendicular coil pairs to produce a rotating radial field (i.e. a field rotating in the plane transverse to the patient).

In the apparatus of FIG. 2, the primary magnetic field generating means 22, the "$\underline{B}_o$ coil", may as discussed above comprise two orthogonal saddle shaped coil pairs fed by two current sources giving sinusoidal currents in quadrature. Alternatively, again as mentioned above, it is possible to use tuned coils having wave winding of the type used for the RF coil discussed by Savelainen (supra) modified to produce a homogeneous field.

The field gradient generating means 23 in the apparatus of FIG. 2 corresponds in structure essentially to the magnetic field gradient generating coil pair assembly 3 of the apparatus of FIG. 1 and comprises five coil pairs. Three of these are the $\underline{B}_{20e}$, $\underline{B}_{220}$ and $\underline{B}_{02}$ coils shown in FIG. 3, the other two are the $B_{12e}$ and $B_{22e}$ coils. The $B_{12e}$ coil is similar to the $B_{120}$ coil but rotated 90° about the k axis. The $B_{22e}$ coil is similar to the $B_{220}$ coil but rotated 45° about the k axis. As with the apparatus of FIG. 1, the apparatus of FIG. 2 is provided with a RF transceiver coil 24 arranged to emit pulses of radiation at a frequency selected to excite nuclear spin transitions in the imaging nuclei within the sample 21. The RF coil 24 may for example be a solenoid disposed coaxial to the z-axis. The RF coil 24 also serves to detect the free induction decay signal from the sample and is controlled by the RF transceiver unit 28 which is itself controlled by computer 27. The detected free induction decay signals are manipulated by computer 27 to produce images which may be displayed by monitor unit 29.

Figure 3:
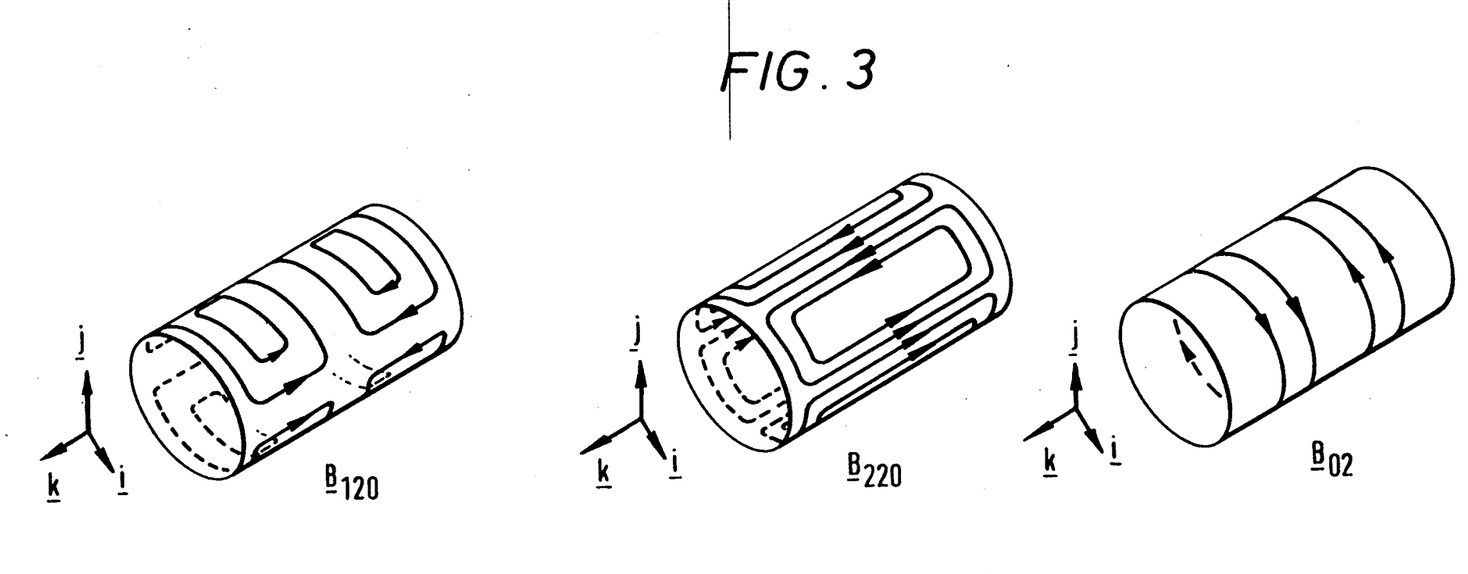
FIG. 3 is a schematic perspective drawing illustrating the relative dispositions of three of the five field gradient generating coils in the apparatus of FIG. 2.

The apparatus of FIG. 2 thus includes a coil assembly capable of producing generally linear magnetic field gradients in any direction and comprising in all five pairs of coils. The field gradients produced by the pairs of coils shown in FIG. 3 (and the $B_{12e}$ and $B_{22e}$ coils corresponding to the $B_{120}$ and $B_{220}$ coils rotated 90° and 45° C. respectively about the k axis) thus have the following magnitudes:

$$B_{02} = -xi - yj + 2zk$$
$$B_{12e} = 3zi + 3xk$$
$$B_{120} = 3zj + 3yk$$
$$B_{22e} = 6xi - 6yj$$
$$B_{220} = 6yi + 6xj$$

Other linear field gradients can be produced by forming linear combinations of the gradients specified above.

The first three gradients $B_{02}$, $B_{12e}$ and $B_{120}$ can be produced using the gradient imposing coils of a conventional MR imaging apparatus arranged to have $B_o$ in the z direction (see FIG. 3). In the conventional apparatus, the k-vector component is active and these three gradients code respectively in the z, x and y directions.

The last two magnetic field gradients $B_{22e}$ and $B_{220}$ may be produced by 4-section saddle coils within gradient coil assembly 23.

For the preferred embodiment of the present invention, the primary magnetic field $B_o$ rotates about the z axis at a frequency of $2\pi\omega$, in other words $B_o$ lies in the direction $i \cos \omega t + \sin \omega t$. Feeding the $B_{02}$ coil with a current with time dependency $\cos \omega t$ gives for the first field gradient:

$$B_{02} = -x\, i\, \cos \omega t - y\, j\, \cos \omega t + 2z\, k\, \cos \omega t.$$

The first term can be considered to correspond to two counter-rotating fields in the xy plane, one of which codes the spins in the x direction. Shifting the phase of the drive current by 90° codes in the y direction. The field gradient component rotating in the opposite direction gives a disturbance to the spin at a frequency $4\pi\omega$. This should, however, not interfere too much, but if necessary it can be eliminated by using instead the last two gradient imposing coil pairs fed in quadrature to give:

$$B_{22e} \cos \omega t + B_{220} \sin \omega t = 6x\, (i \sin \omega t + j \cos \omega t) +$$
$$6y\, (i \cos \omega t - j \sin \omega t)$$

The first vector on the right hand side is in the direction of magnetization and codes the x axis. The second is perpendicular to $B_o$ and is inactive. By shifting the coil currents 90° in phase, the y axis can be coded.

The z axis is coded by feeding $\sin \omega t$ to $B_{12e}$ and $\cos \omega t$ to $B_{120}$. This gives a rotating field without a counter-rotating component. If such a component can be tolerated, then one of these coil pairs can be omitted.

The current supply to the primary field generating and field gradient imposing coil pairs is from an oscillating (AC) power source 30 via amplifier/delay units 31, 32, 33 and 34, the operation of all of these being controlled by computer 27. Computer 27 also controls DC-current feed to the $B_{02}$ coil from amplifier unit 35.

The apparatus and method of the present invention are generally useful within most forms of MRI; however, one important class of MR imaging techniques where the image can be enhanced using the method of the invention comprises the so-called fast imaging methods where information is collected using comparatively strong gradients and large RF bandwidths to facilitate image formation in relatively short time periods, for example less than a second. This is often made possible by collecting all or a considerable part of the needed information during a single excitation of the nuclear spins.

Figure 4:
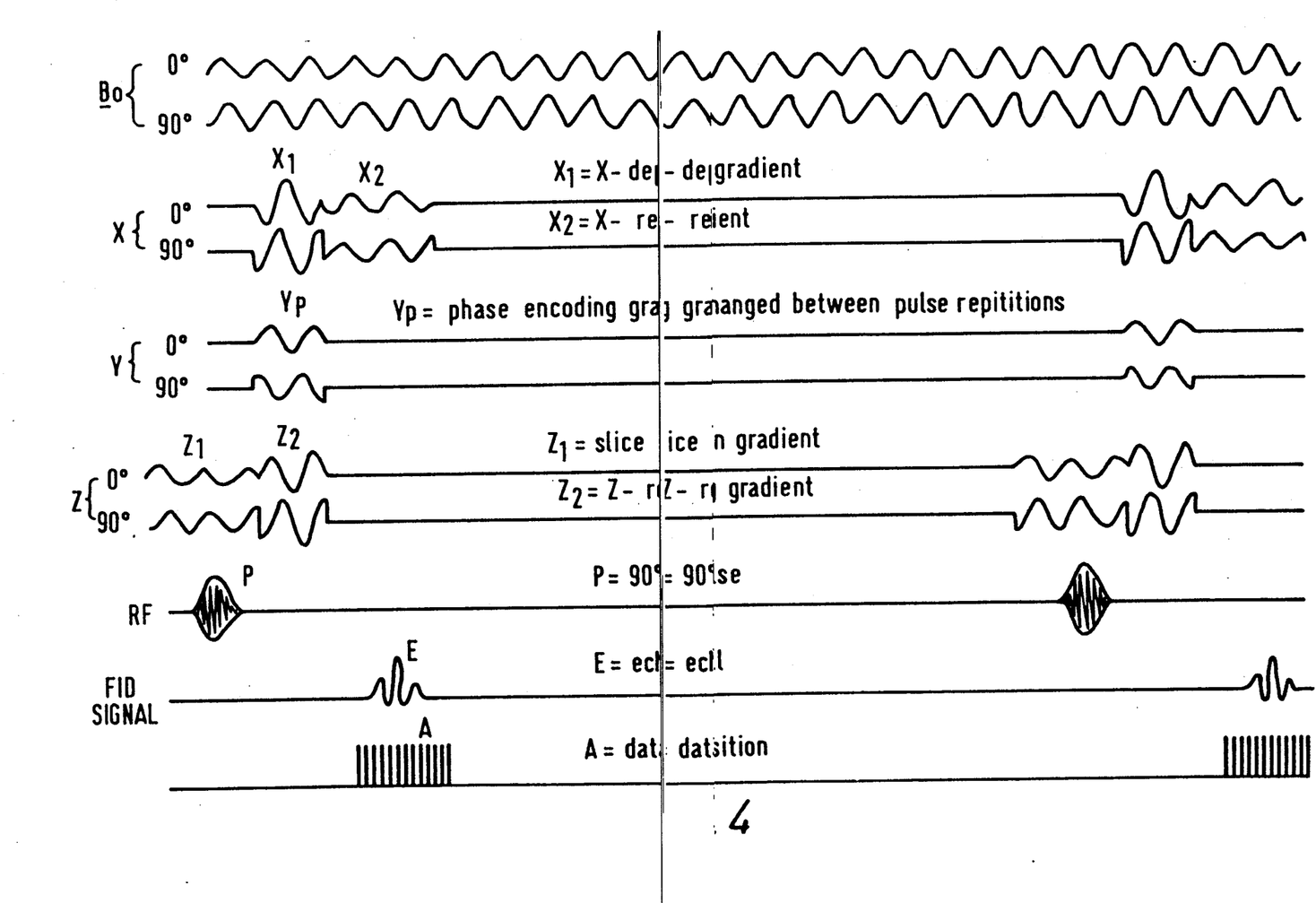
FIG. 4 is a diagram schematically illustrating the field, field gradient and radiation imposition and FID signal and data acquisition during a saturation-recovery pulse sequence performed according to the method of the invention.

Two methods which can form the basis of many variations will now be explained by way of example:

The first method involves a saturation-recovery (SR) pulse sequence as shown in FIG. 4. This is similar to a conventional SR sequence except that $B_o$ and the field gradients rotate. The timing sequences for the current from primary magnet power supply amplifier unit 31 and x, y and z gradient power supply amplifier units 32, 33, 34 are shown in FIG. 4. Instead of using pulsed DC-currents, as in imagers known in the art, each amplifier unit produces a pair of AC-currents in quadrature which is fed to the corresponding coil pair to produce a rotating field vector. The current pulses to the field gradient generating coils otherwise have the same duration, amplitude and function as the DC-pulses conventionally used. This shows clearly how known pulse sequences can readily be modified to be used according to the invention.

Figure 5:
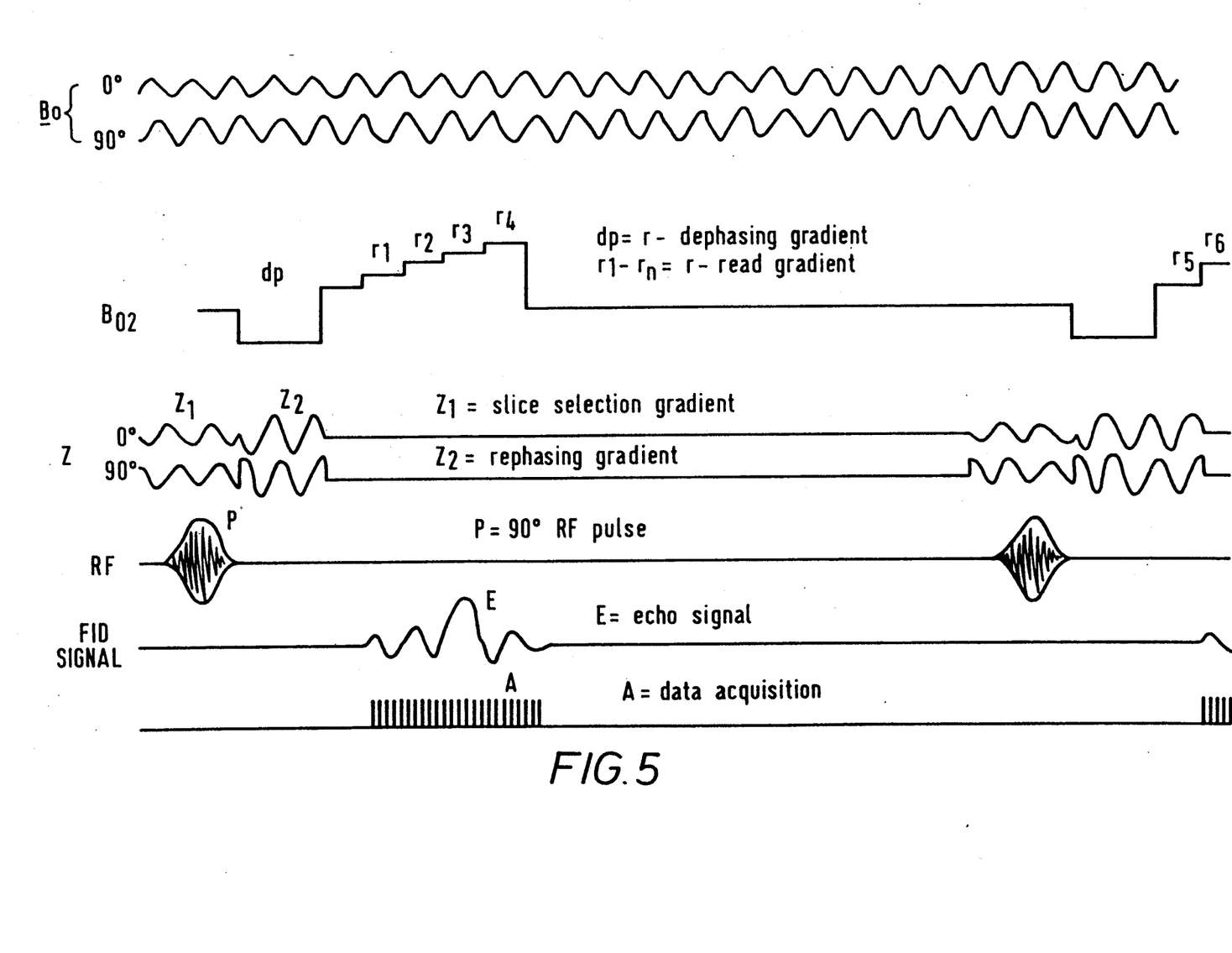
FIG. 5 is a diagram schematically illustrating the field, field gradient and radiation imposition and FID signal and data acquisition during a rapid acquisition pulse sequence performed according to the method of the invention.

The second method is an example of a rapid pulse sequence and is illustrated schematically in FIG. 5. The rotating z-gradient is used to select and excite a "slice" in the same way as in the SR sequence previously exemplified, but instead of using the x and y gradients it employs the $B_{02}$ field gradient with the result explained below.

If the $B_o$ vector is assumed at some given time to have a direction, then since the system is symmetric about the z-axis this direction can be assumed to be i. Looking to the equation for $B_{02}$ given above it will be found that the direction of change, as given by the active-vector component of $B_{02}$ along BHD o, i.e. the i component, is along the x axis. It can therefore be concluded generally that the $B_{02}$ gradient has the property that its direction of field change is always that its direction of field change is always along $B_o$, i.e. it always codes in the $B_o$ direction. The effect is the same as when using a combination of a stationary $B_o$ field with a gradient rotating in the x-y plane.

Returning to FIG. 5, it will be seen that the $B_{02}$ gradient is applied in a manner analogous to the x-gradient in the SR sequence of FIG. 4 so as to produce a signal echo. The signal is now coded in the rotating $B_o$ direction. Data is acquired during n revolutions of $B_o$ at m points during each revolution. The m x n data point set represents an image which can be computed using standard algorithms for the projection reconstruction method. By collecting points during several rotations of $B_o$ during each repetition of the pulse sequence (see FIG. 5), the time for acquiring the necessary data point set can be decreased by a corresponding factor.

The primary advantage of the technique of the present invention is that it results in the apparatus being less susceptible to external perturbing magnetic fields at low frequencies. Another advantage, however, is that pulse sequences for rapid imaging are relatively easy to perform. Yet a further advantage is that fields at the rotational frequency of $B_o$ are comparatively easy to shield using eddy current shields.

I claim:

1. A magnetic resonance imaging apparatus having a primary field generating means for generating a substantially uniform magnetic field, wherein said primary field generating means is arranged in use to generate a magnetic field the field direction of which varies with time.

2. Apparatus as claimed in claim 1 wherein said primary field generating means is arranged in use to generate a magnetic field the field direction of which varies cyclically with time.

3. Apparatus as claimed in claim 2 wherein said primary field generating means is arranged in use to generate a magnetic field the field direction of which rotates about a fixed axis.

4. Apparatus as claimed in claim 3 wherein said primary field generating means is arranged in use to generate a magnetic field the field direction of which rotates at a frequency of 25 to 1000 Hz.

5. Apparatus as claimed in claim 3 wherein said primary field generating means is arranged in use to generate a magnetic field the field direction of which rotates at a frequency of 100 to 500 Hz.

6. Apparatus as claimed in claim 3 arranged to receive power from an AC power supply and wherein said primary field generating means is arranged in use to generate a magnetic field the field direction of which rotates at a frequency which is an even harmonic of the frequency of said AC supply.

7. Apparatus as claimed in claim 5 arranged to receive power from an AC power supply and wherein said primary field generating means is arranged in use to generate a magnetic field the field direction of which rotates at a frequency which is an even harmonic of the frequency of said AC supply 8. In a method of magnetic resonance imaging of a sample which method comprises placing a sample within a substantially uniform primary magnetic field, exposing said sample to radiation of a frequency selected to excite nuclear spin transitions in selected non-zero spin nuclei therein, imposing a magnetic field gradient on said primary field, detecting magnetic resonance signals from said selected nuclei, and generating an image of said sample from said detected signals, the improvement comprising causing the field direction of said primary field to vary with time.

9. A method as claimed in claim 8 wherein the field direction of said primary field is caused to vary cyclically with time.

10. A method as claimed in claim 9 wherein the field direction of said primary field is caused to rotate about a fixed axis.

11. A method as claimed in claim 10 wherein the field direction of said primary field is caused to rotate at a frequency of 25 to 1000 Hz.

12. A method as claimed in claim 11 wherein the field direction of said primary field is caused to rotate at a frequency of 100 to 500 Hz.

13. A method as claimed in claim 10 wherein said field direction is caused to rotate at a frequency which is an even harmonic of the frequency of an AC power supply powering the apparatus by which said imaging method is performed.

14. A method as claimed in claim 12 wherein said field direction is caused to rotate at a frequency which is an even harmonic of the frequency of an AC power supply powering the apparatus by which said imaging method is performed.

15. A method as claimed in claim 8 being a method of electron spin resonance enhanced magnetic resonance imaging.

16. A method as claimed in claim 8 wherein said sample is exposed to nuclear spin system pre-polarizing magnetic field pulses.

* * * * *